United States Patent [19]

Miyajima et al.

[11] Patent Number: 4,816,796
[45] Date of Patent: Mar. 28, 1989

[54] PERMANENT MAGNET DEVICE

[75] Inventors: Goh Miyajima, Katsuta; Takao Takahashi, Hitachi, both of Japan

[73] Assignee: Hitachi, Ltd., Tokyo, Japan

[21] Appl. No.: 103,703

[22] Filed: Oct. 2, 1987

[30] Foreign Application Priority Data

Oct. 3, 1986 [JP] Japan .................. 61-234441

[51] Int. Cl.$^4$ .................................... H01F 7/02
[52] U.S. Cl. .................. 335/306; 335/304; 324/318
[58] Field of Search ........... 335/212, 211, 302, 306, 335/301, 304; 324/318, 319, 320

[56] References Cited

U.S. PATENT DOCUMENTS 3,768,054 10/1973 Neugebauer ............... 335/306
4,578,663 3/1986 Sanders et al. ............ 335/306
4,706,057 11/1987 Schwab ................. 335/304 X

FOREIGN PATENT DOCUMENTS 59-114729 7/1984 Japan .................. 335/304

Primary Examiner—George Harris
Attorney, Agent, or Firm—Antonelli, Terry & Wands

[57] ABSTRACT

In a permanent magnet device, a pair of pole pieces of a ferromagnetic material are disposed opposite to each other, and, in order to generate a homogeneous magnetic field in a gap space between the pole pieces, a pair of members of a permanent magnet material magnetized in a direction substantially orthogonal to the direction of the magnetic field and also magnetized in directions opposite to each other in themselves are disposed adjacent to the pole pieces and symmetrical with each other respectively.

7 Claims, 3 Drawing Sheets

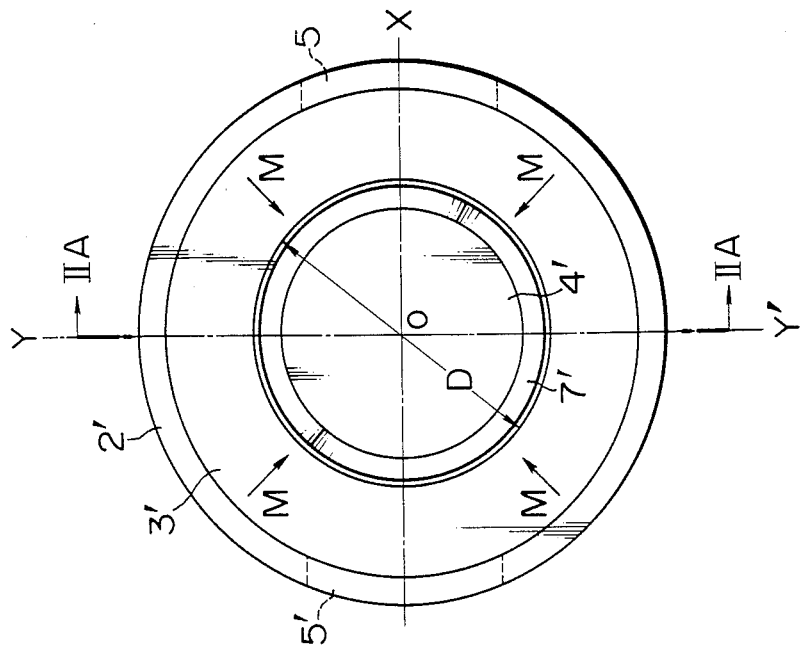
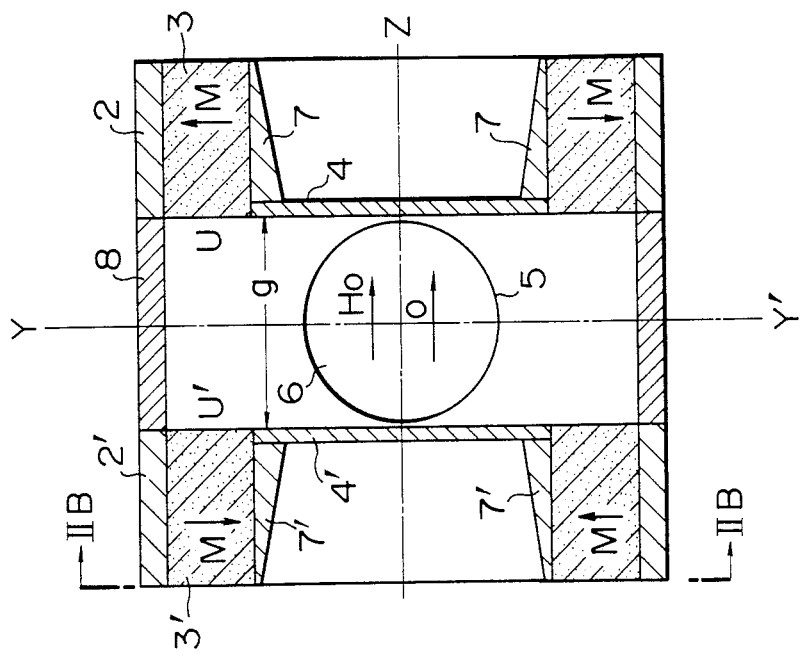

PERMANENT MAGNET DEVICE

BACKGROUND OF THE INVENTION

This invention relates to a permanent magnet device, and more particularly to a magnetic field generator using a permanent magnet, which is suitable for generation of a homogeneous magnetic field. The permanent magnet device of the present invention finds its typical application in a MRI (magnetic resonance imaging) system.

A magnetic field generator using a permanent magnet generally comprises a member of a permanent magnet material and a magnetic path formed by a member of ferromagnetic material.

A typical prior art permanent magnet device designed for generating a homogeneous magnetic field has a structure as shown in FIGS. 1A and 1B. FIG. 1A is a front elevation view of the prior art permanent magnet device when viewed from the line IA—IA in FIG. 1B, and FIG. 1B is a side elevation view of the device when viewed from the line IB—IB in FIG. 1A. In the prior art permanent magnet device shown in FIGS. 1A and 1B, reference numerals 1, 1' and 2, 2' designate magnetic paths formed by members of a ferromagnetic material; 3 and 3' designate members of a permanent magnet material; 4 and 4' designate pole pieces; and 5 and 5' designate windows or holes which have the magnetic paths 2 and 2' respectively. A magnetic field Ho is generated in a gap space (a magnetic field generation space) 6 defined between the pole pieces 4 and 4'.

The homogeneity R (=ΔHo/Ho, where ΔHo represents an amount inhomogeneity of the magnetic field Ho at any point in the space 6) is given by $$R \propto 10^{-(1+D/g)} \quad (1)$$

where D is the diameter of the pole pieces 4 and 4', and g is the length of the gap. Therefore, the larger the diameter D of the pole pieces 4 and 4', and the smaller the gap length g, the field homogeneity R is improved. When, on the other hand, the gap length g is fixed, the diameter D of the pole pieces 4 and 4' must be increased in order to improve the field homogeneity R. This means that the diameter of the permanent magnet members 3 and 3' must also be increased. Thus, when, for example, the diameter D of the pole pieces 4 and 4' is doubled, the required volume of the permanent magnet members 3 and 3' is about $2^2=4$ times as much as that required when the pole piece diameter D is not increased. In the prior art device, therefore, ring shims (refer to Rose M. E. "Magnetic Field Corrections in the Cyclotron", Physical Review, 53, P715, 1938) or current shims (refer to Japanese Patent Publication No. 40-26368; Golay M. J. E.) have been provided on the both ends of the pole pieces 4 and 4', so that the ratio D/g can be minimized thereby improving the homogeneity R of the magnetic field Ho.

In FIG. 1A, all the amounts of the magnetic flux φ generated by the permanent magnet members 3 and 3' do not flow through the gap space 6 defined between the pole pieces 4 and 4'. Suppose, for example, that an Nd-Fe-B alloy, is used as the material of the permanent magnet members 3 and 3', the ratio D/g=2, and the strength of the magnetic field Ho=2 kG. In such a case, about 60% of the total flux φ returns directly to the magnetic paths 1, 1' and portions of the magnetic paths 2, 2' lying in the rear of the horizontal planes S - S' and S" - S''' of the respective pole pieces 4 and 4' and does not directly contribute to the generation of the magnetic field Ho in the gap space 6.

Between the horizontal planes S - S' and S" - S''', the amount of leakage magnetic flux between the magnetic paths 2 and 2' and the magnetic members 3 and 3' depends on the distance therebetween. When the distance between the permanent magnet members 3, 3' and the magnetic paths 2, 2' is short, the amount of leakage magnetic flux increases, and therefore the diameter of the magnetic paths 2 and 2' cannot be decreased. When the diameter of the magnetic paths 2 and 2' is about two times as large as that of the permanent magnet members 3 and 3', the leakage flux is about 15% of the total magnetic flux φ. The remaining amount, which is about 25% of the total magnetic flux φ, flows through the gap space 6 between the pole pieces 4 and 4' and contributes to the generation of the magnetic field Ho.

As an example of known permanent magnet devices, that disclosed in JP-A No. 60-210804 is taken as a reference herein. This prior art discloses a permanent magnet device in which a magnetic field is generated in parallel to a gap space.

It will be apparent from the above description that, in the prior art permanent magnet device shown in FIGS. 1A and 1B, about 60% of the total amount of generated magnetic flux φ does not provide the inward pushing force acting upon the flow of magnetic flux through the gap space 6. Only about 15% of the total amount of magnetic flux φ provides the inward pushing force acting upon the flow of magnetic flux through the gap space 6, thereby homogeneizing the magnetic field Ho produced by the flow of magnetic flux through the gap space 6.

The prior art permanent magnet device shown in FIGS. 1A and 1B has the defect that the amount of magnetic flux acting to homogenize the magnetic field is small, and the ratio D/g must be increased in order to improve the homogeneity of the magnetic field generated in the gap space. Consequently, the prior art permanent magnet device is defective in that the size and weight of the magnetic field generator inevitably increase resulting in a high cost.

SUMMARY OF THE INVENTION

With a view to obviate these prior art defects, it is an object of the present invention to provide a small-sized magnetic field generator using a permanent magnet, which improves the homogeneity of a generated magnetic field.

In accordance with the present invention which attains the above object, there is provided a permanent magnet device comprising a pair of pole pieces of a ferromagnetic material disposed opposite to each other, and a pair of members of a permanent magnet material generating a magnetic field in a gap space between the pole pieces and magnetized in a direction substantially orthogonal to the direction of the magnetic field and also magnetized in directions opposite to each other, the permanent magnet members being disposed adjacent to the pole pieces and symmetrical with each other respectively.

Because of the above construction of the permanent magnet device of the present invention, the homogeneity of the magnetic field in the gap space is improved over that of the prior art device. Thus, when the field homogeneity attained by the device of the present invention is the same as that attained by the prior art device, the ratio D/g between the diameter D of the pole pieces and the length g of the gap space can be made smaller in the present invention than that of the prior art device. Therefore, when the gap length g is fixed, the diameter D of the pole pieces can be made smaller in the present invention than that of the prior art device. That is, the size and weight of the permanent magnet device of the present invention can be made smaller and lighter than those of the prior art device.

BRIEF DESCRIPTION OF THE DRAWINGS

FIGS. 2A and 2B show the structure of an embodiment of the permanent magnet device according to the present invention.

DESCRIPTION OF THE PREFERRED EMBODIMENTS

A preferred embodiment of the permanent magnet device according to the present invention will now be described in detail with reference to FIGS. 2A and 2B and FIGS. 3 and 4.

Figure 1B:
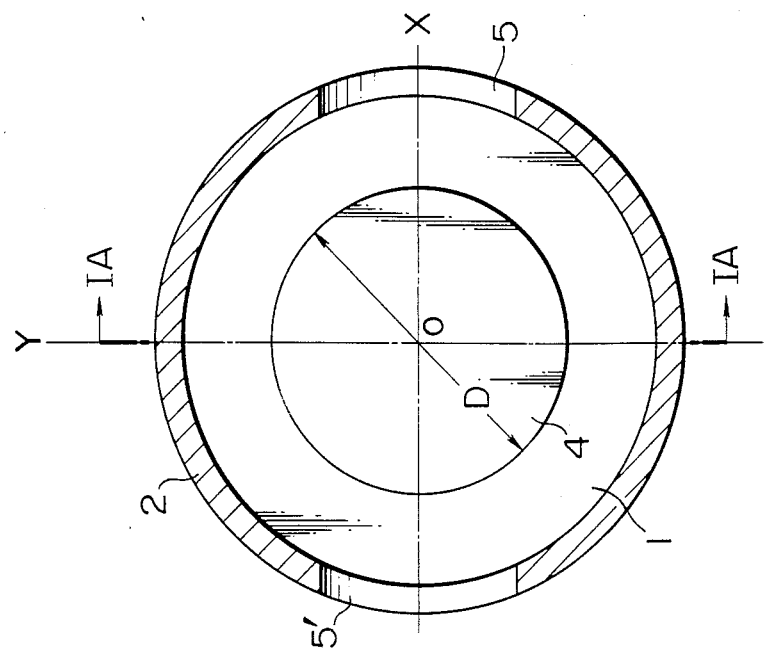
FIGS. 1A and 1B show the structure of a prior art permanent magnet device.
Figure 1A:
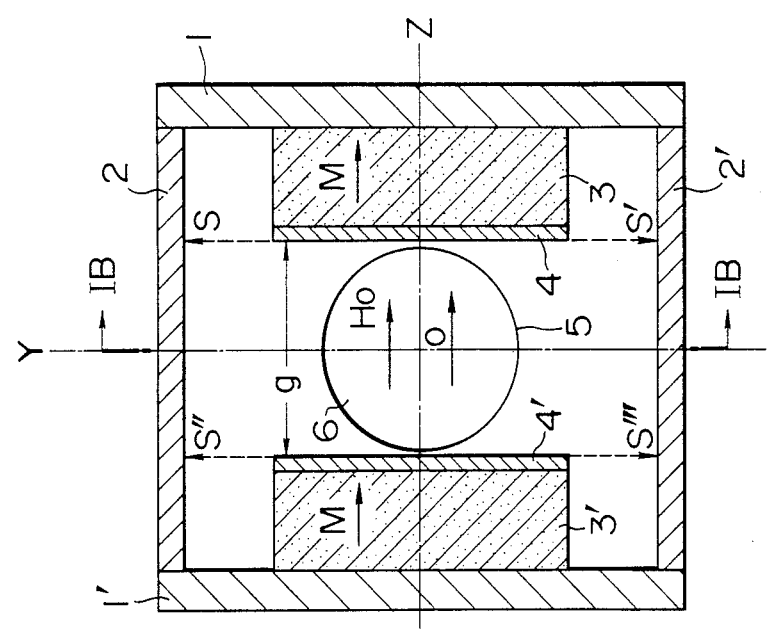

In FIGS. 2A and 2B showing the structure of one embodiment of the permanent magnet device of the present invention, like reference numerals are used to designate like parts appearing in FIGS. 1A and 1B. FIG. 2A is a front elevation view of the permanent magnet device when viewed from the line IIA—IIA in FIG. 2B, and FIG. 2B in a side elevation view of the device when viewed from the line IIB—IIB in FIG. 2A.

Referring to FIGS. 2A and 2B, annular members 3 and 3' of a permanent magnet material are disposed inside of magnetic paths 2 and 2' formed by hollow cylindrical members of a ferromagnetic material, respectively. As shown by the arrows M in FIGS. 2A and 2B, the permanent magnet members 3 and 3' are magnetized in a direction substantially orthogonal to the direction of a magnetic field generated i a gap space 6 and also magnetized in directions opposite to each other. At positions inside the permanent magnet members 3 and 3', pole pieces 7, 7' and 4, 4' of a ferromagnetic material forming inner magnetic paths are disposed in such a relation that the pole pieces 7, 7' and 4, 4' make surface-to-surface contact with the permanent magnet members 3 and 3', respectively. The lines of magnetic flux generated by the permanent magnet members 3 and 3' are oriented to flow through the gap space 6 past the inner magnetic paths 7, 7' and pole pieces 4, 4' For the purposes of minimizing the weight of the permanent magnet device and improving the homogeneity of the magnetic field Ho in the gap space 6, the thickness of the inner magnetic paths 7 and 7' is selected to be as small as possible without causing any magnetic saturation and is progressively increased toward the gap space 6. The pole pieces 4 and 4' are located to define the gap space 6 therebetween.

In the illustrated embodiment, the pole pieces 4 and 4' lie on the same planes as those of the end faces U and U' of the permanent magnet members 3 and 3', respectively. However, the pole pieces 4 and 4' may project from these end faces U and U' of the respective permanent magnet members 3 and 3' without giving rise to any practical problem. Further, the ring shims or current shims may be provided to further improve the homogeneity of the magnetic field Ho in the gap space 6.

In the illustrated embodiment, a magnetic path 8 of a ferromagnetic material has the same shape as that of the magnetic paths 2 and 2'. However, these magnetic paths may be formed by a plurality of hollow pillarlike or columnar members. In the illustrated embodiment, windows or holes 5 and 5' are provided in the magnetic path 8 so that a body to be examined can be inserted into and withdrawn from the gap space 6 through these holes 5 and 5'.

The sum of the amount of magnetic flux leaking from the permanent magnet members 3 and 3' directly to the magnetic path 8 and the amount of magnetic flux leaking from the permanent magnet members 3 and 3' to the magnetic path 8 through outer portions of the inner magnetic paths 7, 7' and pole pieces 4, 4' is about 55 to 60% of the total amount of magnetic flux $\phi$ generated from the permanent magnet members 3 and 3'. On the other hand, the amount of magnetic flux from the inner magnetic paths 7 and 7' to the magnetic paths 2 and 2' through an outer space is about 15% of the total amount of magnetic flux $\phi$ generated from the permanent magnet members 3 and 3' Also, the amount of magnetic flux flowing through the gap space 6 between the pole pieces 4 and 4' is about 25 to 30% of the total amount of magnetic flux $\phi$ generated from the permanent magnet members 3 and 3'. The above percentages were obtained as a result of an experiment conducted on the permanent magnet device of the present invention under the same conditions as those of the prior art device. That is, the permanent magnet members 3 and 3' were made of an Nd-Fe-B alloy, the ratio D/g between the diameter D of the pole pieces 4 and 4' and the gap length g between the pole pieces 4 and 4' was D/g=2, and the strength of the magnetic field Ho was Ho=2 kG.

In the illustrated embodiment, the diameter of the magnetic paths 2 and 2' can be made far smaller than that in the prior art device, that is, about 70% of that in the prior art device. Further, the permanent magnet device embodying the present invention does not include the magnetic paths 1 and 1' included in the prior art device, and the amount of the ferromagnetic material forming the inner magnetic paths 7 and 7' is smaller than that forming the magnetic paths 1 and 1' in the prior art device. Thus, the permanent magnet device embodying the present invention can be made smaller in size and lighter in weight than the prior art device.

Next, the homogeneity of the magnetic field in the gap space 6 will be considered. It is apparent that the homogeneity of the magnetic field is improved when the magnetic flux flowing through the gap space 6 is pushed inward from the outside. In the permanent magnet device embodying the present invention, about 55 to 60% of the total amount of magnetic flux generated from the permanent magnet members 3 and 3' leaks to the magnetic path 8 while surrounding the gap space 6, thereby producing a great force acting to push the flow of magnetic flux inward from the outside.

In the prior art device, only about 15% of the total amount of magnetic flux contributes to produce this inward pushing force. Thus, according to simple comparison between the inward pushing force of the present invention and that of the prior art device, the former is about four times as strong as the latter. Further, because the space surrounding the flow of magnetic flux in the permanent magnet device embodying the present invention is less than ½ of that in the prior art device, the magnetic flux density B in the device of the present invention is correspondingly higher. Therefore, it will be readily understood that the inward pushing force becomes correspondingly greater.

Figure 4:
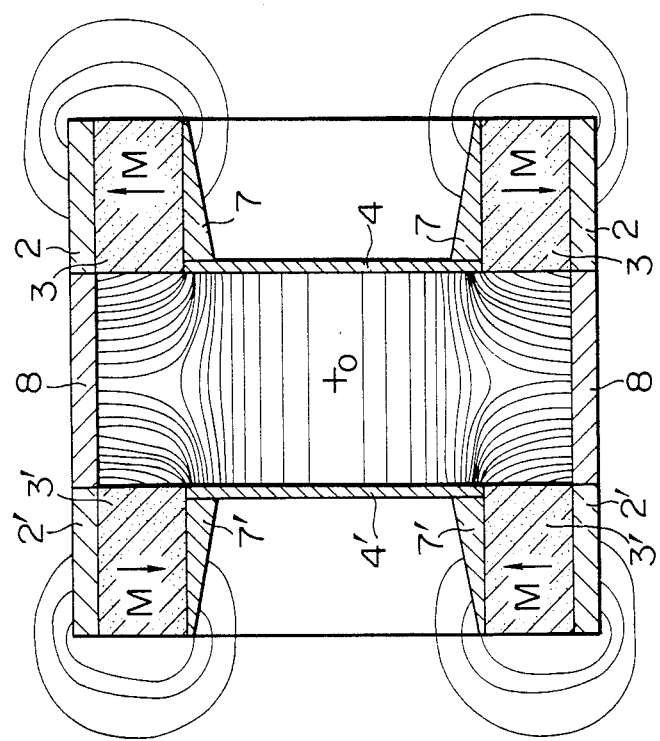
FIG. 4 shows the flow of magnetic flux in the space of the device of the present invention.
Figure 3:
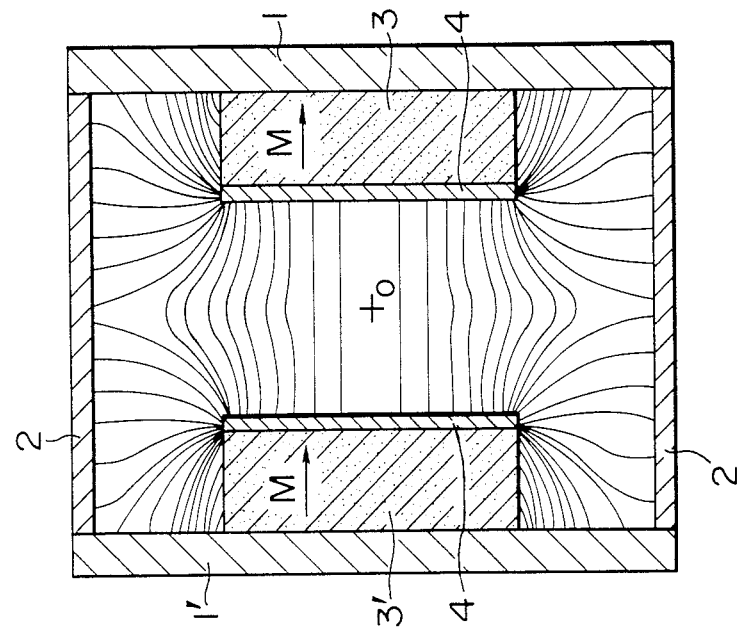
FIG. 3 shows the flow of magnetic flux in the inner space of the prior art device.

FIG. 3 shows a qualitative analysis of the flow of magnetic flux in the prior art permanent magnetic device for the purpose of comparison, and FIG. 4 shows a qualitative analysis of the flow of magnetic flux in the permanent magnet device embodying the present invention. It will be readily understood from comparison between FIGS. 3 and 4 that the force acting to push the flow of magnetic flux inward from the outside in the device of the present invention is greater than that in the prior art device.

Therefore, it is apparent that, when the ratio D/g in the device of the present invention is the same as that in the prior art device, the homogeneity of the magnetic field in the gap space 6 is more improved in the device of the present invention than that in the prior art device. On the other hand, when the field homogeneity is the same, the ratio D/g in the device of the present invention is smaller than that in the prior art device, and when the gap length g is the same, the diameter D of the pole pieces 4 and 4' is smaller than that in the prior art device. Therefore, the diameter of the permanent magnet members 3 and 3' in the device of the present invention can be decreased. For example, the ratio D/g is selected to be D/g=1.5 in the device of the present invention, the volume of the permanent magnet members 3 and 3' can be decreased to be less than 60% of that required when the ratio D/g=2, and saving of the expensive permanent magnet material can be attained. Further, the magnetic path forming members can be made smaller in size and lighter in weight than those in the prior art device. Therefore, the size and weight of the permanent magnet device of the present invention shown in FIGS. 2A and 2B can be greatly decreased as compared to those of the prior art device, provided that the magnetic field strength, gap length and magnetic field homogeneity are the same.

We claim:

1. A permanent magnet device comprising a pair of pole pieces of a ferromagnetic material disposed opposite to each other, and a pair of members of a permanent magnet material generating a magnetic field in a gap space between said pole pieces, said pair of members being magnetized radially with respect to an axis which passes along the center of said magnetic field and is parallel thereto, and in a direction substantially orthogonal to the direction of said magnetic field and also in directions opposite to each other, and disposed adjacent to said pole pieces and symmetrical with each other respectively.

2. A permanent magnet device according to claim 1, wherein said pole pieces are cylindrically recessed so as to be free from any complete magnetic saturation respectively.

3. A permanent magnet device according to claim 2, wherein each of said pole pieces having the recessed parts includes a tapered portion disposed adjacent to the corresponding one of said permanent magnet members and having its thickness progressively increased toward said gap space and a flat plate portion facing said gap space.

4. A permanent magnet device according to claim 2, further comprising first magnetic paths formed by members of a ferromagnetic material adjoining the surfaces of said permanent magnet members remote from the surfaces where said permanent magnet members adjoin said pole pieces respectively.

5. A permanent magnet device according to claim 3, further comprising first magnetic paths formed by members of a ferromagnetic material adjoining the surfaces of said permanent magnet members remote from the surfaces where said permanent magnet members adjoin said pole pieces respectively.

6. A permanent magnet device according to claim 4, further comprising a second magnetic path formed by a member of a ferromagnetic material interposed between said first magnetic paths, said second magnetic path being tubular and provided with holes opposite to each other through said gap space.

7. A permanent magnet device according to claim 5, further comprising a second magnetic path formed by a member of a ferromagnetic material interposed between said first magnetic paths, said second magnetic path being tubular and provided with holes opposite to each other through said gap space.

* * * * *